(12) United States Patent
Hartig

(10) Patent No.: US 9,882,110 B2
(45) Date of Patent: Jan. 30, 2018

(54) THERMOELECTRIC DEVICE TECHNOLOGY

(71) Applicant: CARDINAL CG COMPANY, Eden Prairie, MN (US)

(72) Inventor: Klaus Hartig, Avoca, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 0 days.

(21) Appl. No.: 14/887,036

(22) Filed: Oct. 19, 2015

(65) Prior Publication Data

US 2016/0111624 A1     Apr. 21, 2016

Related U.S. Application Data

(63) Continuation of application No. 13/666,263, filed on Nov. 1, 2012.

(60) Provisional application No. 61/554,654, filed on Nov. 2, 2011.

(51) Int. Cl.
| | |
|---|---|
| H01L 35/34 | (2006.01) |
| H01L 35/32 | (2006.01) |
| H02S 10/10 | (2014.01) |
| C23C 14/34 | (2006.01) |

(52) U.S. Cl.
CPC .............. H01L 35/34 (2013.01); C23C 14/34 (2013.01); H01L 35/32 (2013.01); H02S 10/10 (2014.12)

(58) Field of Classification Search
CPC ......... H01L 35/02; H01L 35/04; H01L 35/32; H01L 35/34; H01L 25/00; H01L 25/02; H01L 25/04; H01L 25/32; H01L 25/34; H01L 35/00
See application file for complete search history.

(56) References Cited

U.S. PATENT DOCUMENTS

| | | |
|---|---|---|
| 4,453,030 A | 6/1984 | David et al. |
| 4,710,588 A | 12/1987 | Ellion |
| 5,224,978 A | 7/1993 | Hermant et al. |
| 5,981,866 A | 11/1999 | Edelson et al. |

(Continued)

FOREIGN PATENT DOCUMENTS

| | | |
|---|---|---|
| DE | 19919023 A1 | 12/2000 |
| DE | 102006014414 A1 | 10/2007 |

(Continued)

OTHER PUBLICATIONS

International Patent Application No. PCT/US2012/063010, International Search Report mailed Mar. 15, 2013, 3 pages.

(Continued)

*Primary Examiner* — Bethany L Martin
(74) *Attorney, Agent, or Firm* — Fredrikson & Byron, P.A.

(57) ABSTRACT

A thermoelectric device for use with solar cells or other heat sources. A substrate has a manufactured surface with a plurality of highland features and lowland features. Each highland feature defines a peak adjacent to which there is an interface of two different film regions (formed of two different metals, two different semiconductors, or one metal and one semiconductor). The two film regions diverge away from each other with increasing distance from the interface and terminate at distal end regions. In response to a temperature difference between the interface and the distal end regions, the device produces a voltage.

6 Claims, 9 Drawing Sheets

(56) References Cited

U.S. PATENT DOCUMENTS

| | | |
|---|---|---|
| 6,239,356 B1 | 5/2001 | Edelson |
| 6,323,417 B1 | 11/2001 | Gillespie et al. |
| 6,410,840 B1 | 6/2002 | Sudo et al. |
| 6,708,526 B2 | 3/2004 | Hishinuma et al. |
| 7,355,114 B2 | 4/2008 | Ojima et al. |
| 7,495,305 B2 | 2/2009 | May et al. |
| 7,615,391 B2 | 11/2009 | Ojima et al. |
| 7,696,589 B2 | 4/2010 | May et al. |
| 8,420,926 B1 | 4/2013 | Reedy et al. |
| 2002/0166839 A1* | 11/2002 | Ghoshal ............... H01L 35/16 216/11 |
| 2007/0290287 A1 | 12/2007 | Freedman |
| 2010/0154862 A1 | 6/2010 | Schiavoni et al. |
| 2010/0212713 A1 | 8/2010 | Sasaki et al. |
| 2010/0269879 A1* | 10/2010 | Leavitt ................. H01L 35/34 136/205 |
| 2011/0048486 A1 | 3/2011 | Sensui et al. |
| 2011/0048489 A1 | 3/2011 | Gabriel et al. |
| 2011/0222149 A1* | 9/2011 | Saito .................. F21K 9/00 359/443 |

FOREIGN PATENT DOCUMENTS

| | | |
|---|---|---|
| JP | H05-226704 A | 9/1993 |
| JP | H10-303469 A | 11/1998 |
| WO | 2009100809 A2 | 8/2009 |

OTHER PUBLICATIONS

Definition of Interface, Menlam-Webster, obtained May 19, 2015 from <http://www.merriam-webster.com/dictionary/interface>, 1 page.

Definition of Tip, Merriam-Webster, obtained May 19, 2015 from <http://www.merriam-webster.com/dictionary/tip>, 6 pages.

Definition of Pyramid, Merriam-Webster, obtained May 19, 2015 from <http://www.merriam-webster.com/dictionary/pyramid>, 1 page.

"Thermoelectric Generator," Wikipedia, the free encyclopedia, last modified on Jul. 19, 2011, 2 pages.

* cited by examiner

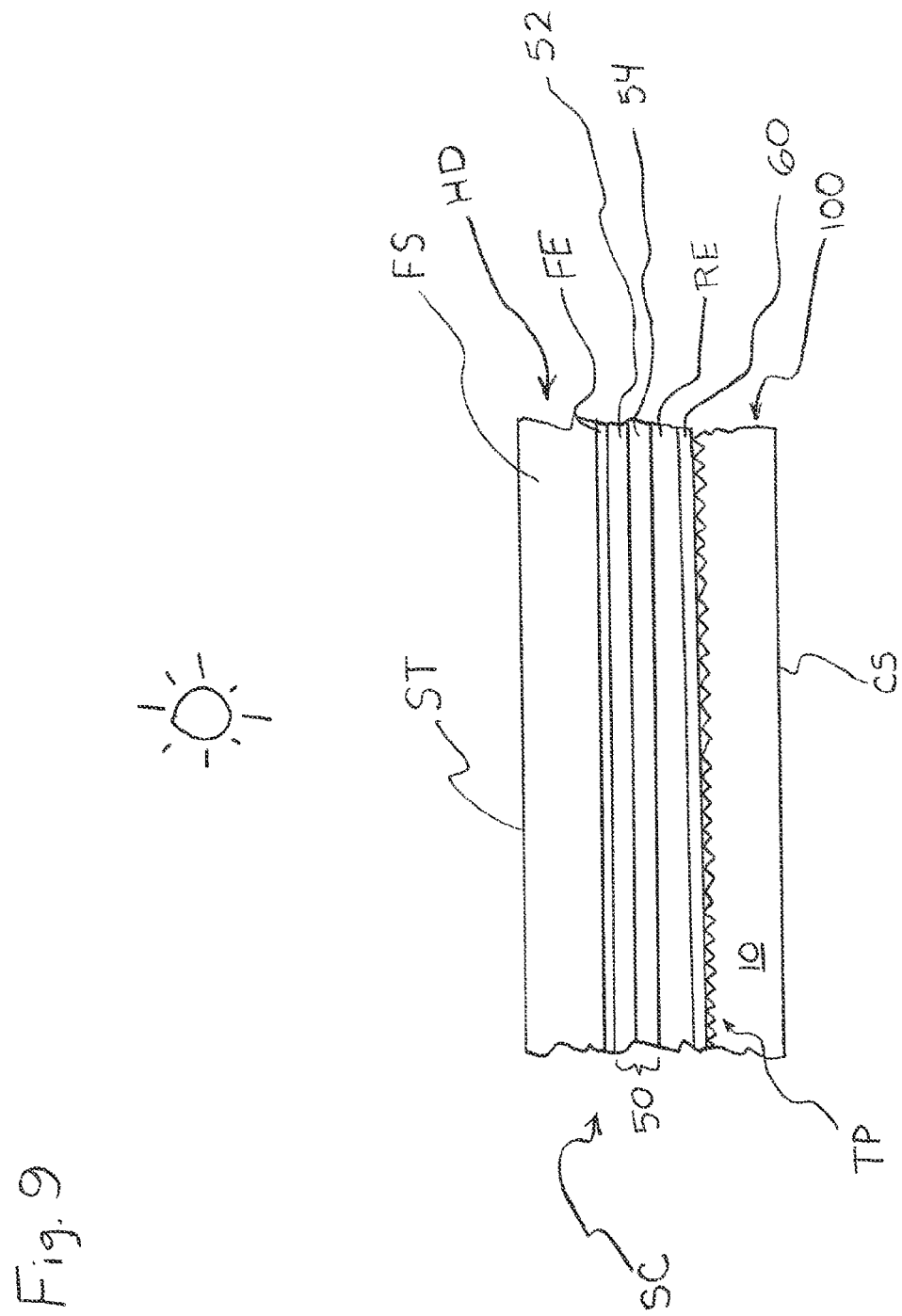

THERMOELECTRIC DEVICE TECHNOLOGY

FIELD OF THE INVENTION

The present invention relates to devices that generate electricity using the thermoelectric effect. In particular, this invention relates to a thermoelectric device that can be used with solar cells or other devices that are characterized by having a high temperature.

BACKGROUND OF THE INVENTION

The thermoelectric effect is well known. It involves converting a temperature difference into an electric voltage, or vice versa. When a thermoelectric device has two sides at different temperatures (i.e., a hot side and a cold side), the device creates a voltage.

Many machines, devices, and other objects generate a great deal of heat that is never recycled in any way, but rather is lost as waste heat. As just one example, solar cells use some of the radiation that strikes them, but waste a great deal of energy in the form of heat. It has therefore previously been suggested that increased efficiency may be obtained by providing a combined solar cell/thermoelectric device. See U.S. Pat. No. 4,710,588 (Hughes Aircraft Company), which focuses on a combined solar cell/thermoelectric device for aerospace applications.

It would be desirable to provide improved thermoelectric devices that provide a practical option for use with solar cells and other devices, machines, or objects that generate, emit, and/or possess heat.

SUMMARY OF THE INVENTION

In certain embodiments, the invention provides a thermoelectric device comprising a substrate having a manufactured surface comprising a plurality of highland features and a plurality of lowland features. Preferably, each highland feature defines a peak adjacent to which there is an interface of two different film regions.

Some embodiments of the invention provide a thermoelectric device comprising a glass sheet having a patterned surface that includes a plurality of peaks and a plurality of valleys. Coated onto each peak are two different film regions. At an apex of each peak, there is an interface of the two different film regions, and the two different film regions diverge away from each other with increasing distance from the interface and terminate at distal end regions. The two different film regions together form a thermocouple such that in response to a temperature difference between the interface and the distal end regions of the two different film regions, the device produces a voltage.

Certain embodiments of the invention provide a photovoltaic, thermoelectric module comprising a photovoltaic device and a thermoelectric device. The photovoltaic device has opposed front and rear faces and includes a front electrode, a rear electrode, and a photovoltaic film between the front and rear electrodes. The front face of the photovoltaic device is adapted to receive incident solar radiation. The thermoelectric device comprises a substrate having a manufactured surface comprising a plurality of highland features and a plurality of lowland features. Each highland feature defines a peak adjacent to which there is an interface of two different film regions. In the present embodiments, the manufactured surface of the substrate is carried against the photovoltaic device such that the highland features contact the rear face of the photovoltaic device.

In some embodiments, the invention provides a method of producing a thermoelectric device. The method involves providing a substrate having a manufactured surface comprising a plurality of peaks and a plurality of valleys. A set of first surfaces face a first common direction, and a set of second surfaces face a second common direction. The first surfaces are on one side of the peaks, while the second surfaces are on another side of the peaks. A first directional coating operation is performed so as to deposit a first film composition on the first surfaces, and a second directional coating operation so as to deposit a second film composition on the second surfaces. After performing the first and second coating operations, adjacent each peak there is an interface of two different film regions, one comprising the first film composition, the other comprising the second film composition. The two different film regions diverge away from each other with increasing distance from the interface and terminate at distal end regions. In response to a temperature difference between the interface and the distal end regions of the two different film regions, the device produces a voltage.

BRIEF DESCRIPTION OF THE DRAWINGS

FIG. 9 is a broken away cross sectional detail view of region BB from FIG. 8.

DETAILED DESCRIPTION OF PREFERRED EMBODIMENTS

Figure 1:
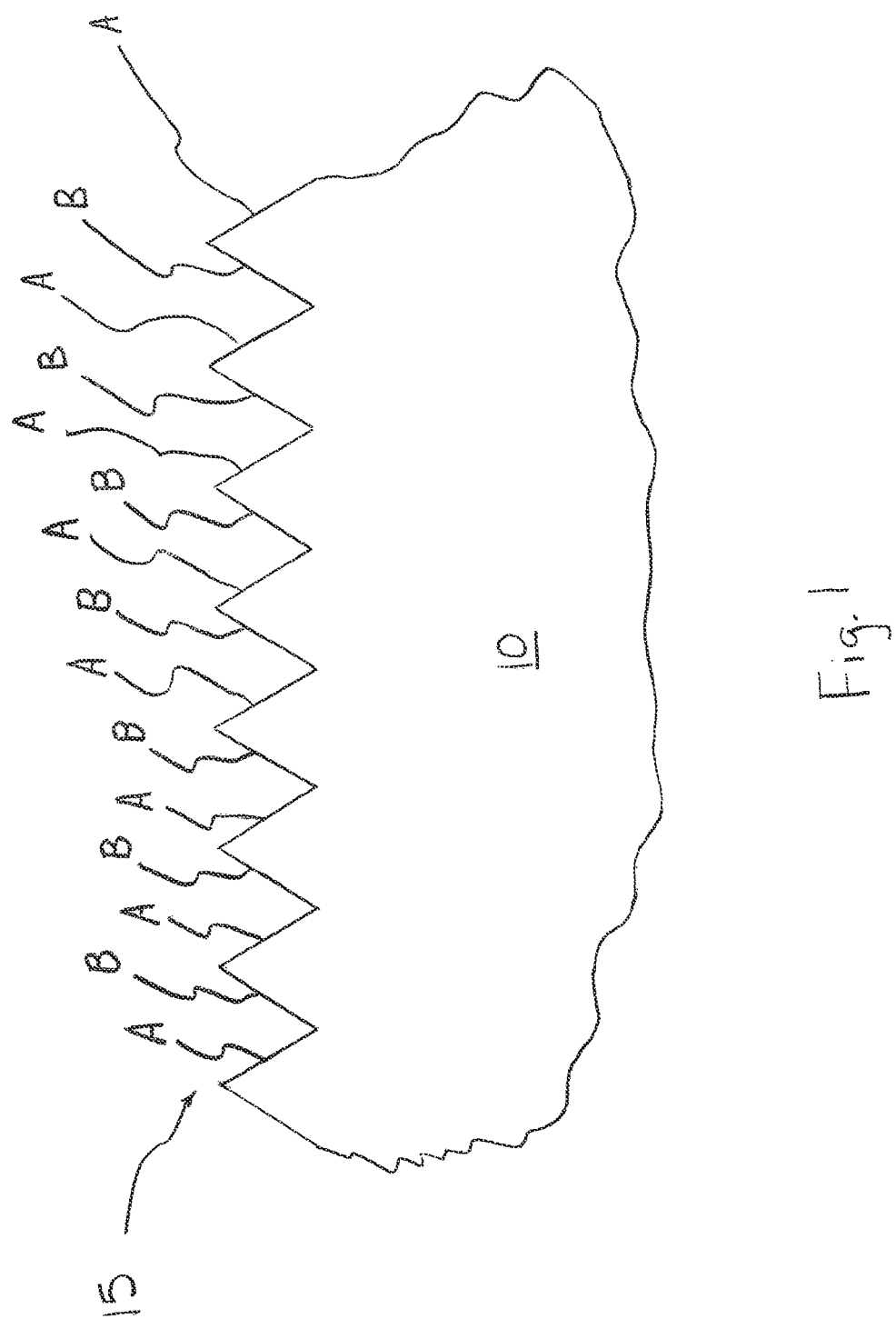
FIG. 1 is a broken away schematic cross sectional view of a substrate having a manufactured surface comprising a plurality of peaks and a plurality of valleys in accordance with certain embodiments of the present invention.

The following detailed description is to be read with reference to the drawings, in which like elements in different drawings have like reference numerals. The drawings, which are not necessarily to scale, depict selected embodiments and are not intended to limit the scope of the invention.

Skilled artisans will recognize that the examples provided herein have many useful alternatives that fall within the scope of the invention.

Many machines, devices, and other objects generate, emit, and/or possess (at least at certain times) a great deal of heat that is never recycled, but rather is lost as waste heat. Solar cells, for example, use some of the radiation that strikes them, but waste a lot of energy in the form of heat. As another example, spandrels on buildings can become quite hot, e.g., by virtue of the solar radiation incident upon them. While there may be exceptions, the heat from spandrels typically is not recycled in any way. The situation is similar with many furnaces, air conditioners, and other HVAC components that generate or emit heat. Similarly, the heat from many engines is lost as waste heat. These (and all other such machines, devices, and objects) are broadly referred to herein as "heat source devices."

The present invention provides a thermoelectric device adapted for use with a heat source device. In certain embodiments, the heat source device presents (e.g., has) a hot surface, a hot body, or some other hot area (at least some of the time, e.g., during operation or use) to which the thermoelectric device can be (e.g., is) coupled. In other embodiments, the heat source device presents a cold surface, a cold body, or some other cold area to which the thermoelectric device can be (e.g., is) coupled.

Figure 6:
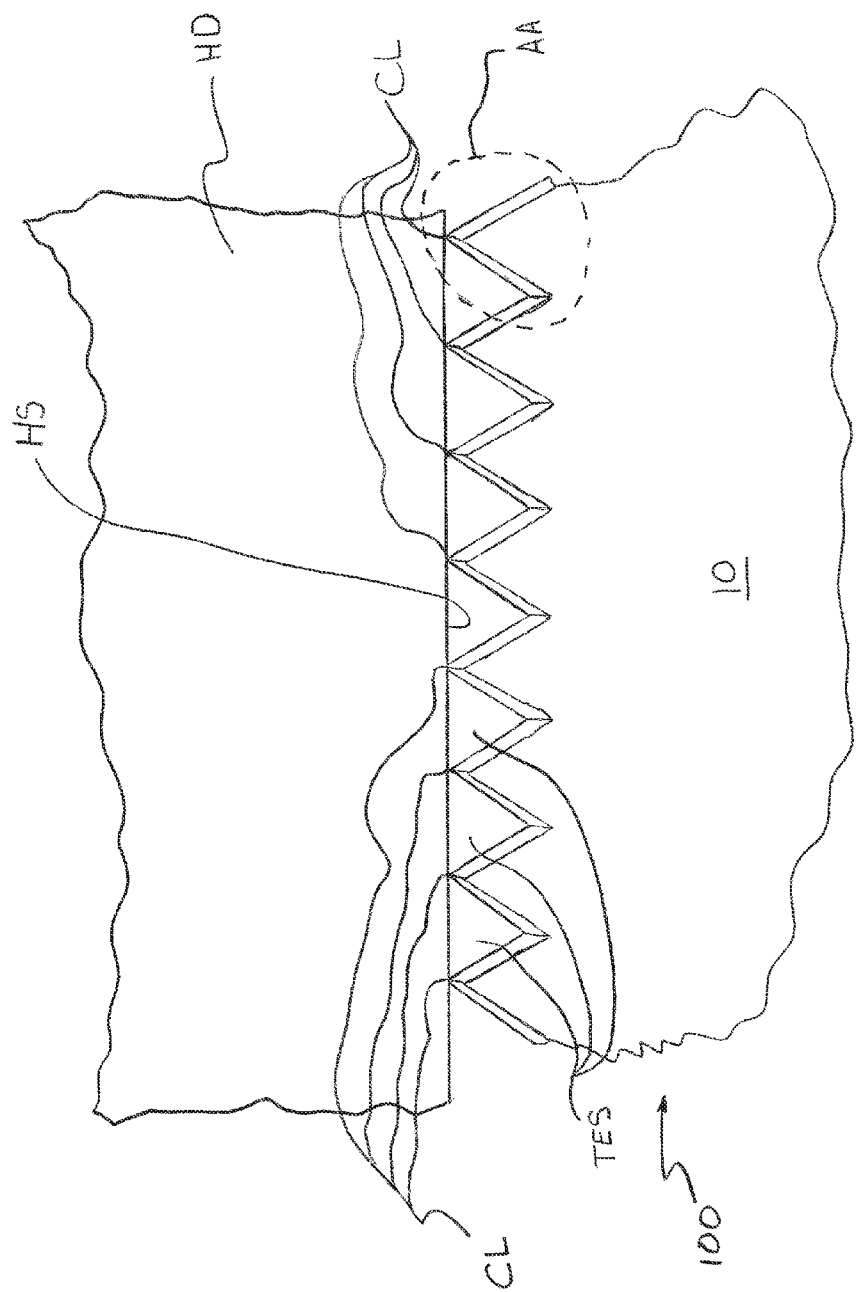
FIG. 6 is a broken away schematic cross sectional view of an exemplary thermoelectric device coupled to a heat source device in accordance with certain embodiments of the invention.

FIG. 6 is a schematic illustration of a heat source device HD to which there is coupled a thermoelectric device 100 in accordance with certain embodiments of the invention. Here, the illustrated heat source device HD has a hot surface (or hot face) HS to which the thermoelectric device is coupled. The illustrated hot surface HS preferably comprises (e.g., is) planar or substantially planar. While this is by no means required, such a configuration lends itself nicely to certain preferred designs of the present thermoelectric device 100, as discussed below.

Preferably, the thermoelectric device 100 is carried against, or otherwise connected thermally to, the hot surface HS of the heat source device HD. For example, the thermoelectric device 100 can optionally be carried against the heat source device HD such that multiple lines of thermal contact, points of thermal contact, and/or other localized regions of thermal contact are provided between the heat source device HD and the thermoelectric device 100. In some preferred embodiments, a pattern of thermal contact (e.g., a predetermined thermal contact pattern) is provided between the heat source device HD and the thermoelectric device 100. More will be said of this later.

Figure 2:
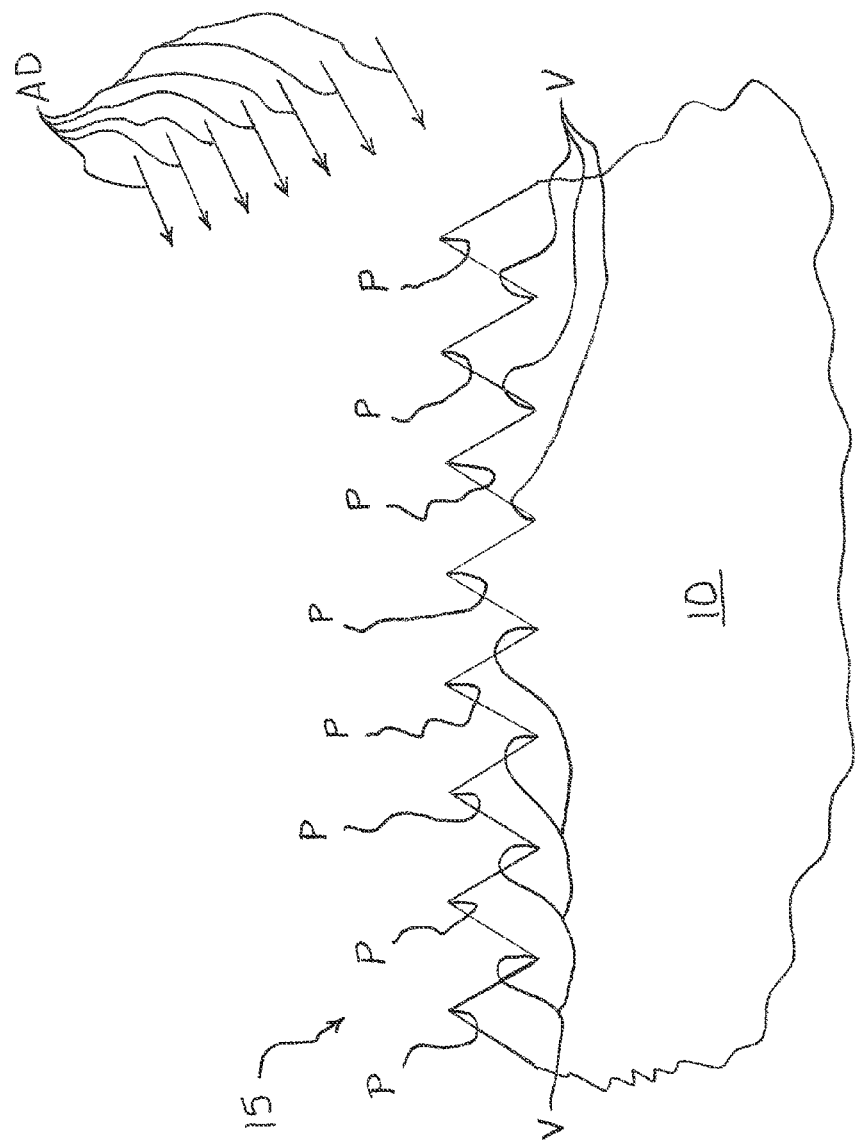
FIG. 2 is a broken away schematic cross sectional view of the substrate of FIG. 1, depicting a first directional coating angle in accordance with certain embodiments of the invention.

The thermoelectric device 100 comprises a substrate 10 having a manufactured surface (or a manufactured face, side, or another type of manufactured interface) 15, which can optionally have a plurality of highland features P and a plurality of lowland features V. Reference is made to FIG. 2. Here, each illustrated highland feature P comprises a peak, and each lowland feature V comprises a valley, although this is not required. The illustrated peak configuration terminates at a tip-like apex. However, other peak configurations are contemplated. For example, the peaks may have rounded or flat apex regions. Similarly, while the lowland features V are shown as valleys that terminate in sharp V-shaped bottoms, the bottoms of other suitable lowland features may be rounded, flat, etc.

The illustrated peaks and valleys of the manufactured surface 15 can optionally be elongated so as to extend (or "run") parallel to one another across a length or width of the substrate (or they may run crosswise at an angle across the substrate). In such cases, each valley can optionally be located (e.g., defined) between two adjacent peaks. In other embodiments, rather than providing a manufactured surface having a field of elongated channels and peaks, it is possible to provide peaks shaped like individual cones, pyramids, spikes, etc.

The substrate 10 can be chosen from a wide variety of transparent or opaque substrate types. In many cases, the substrate 10 will comprise glass, e.g., it can optionally be a glass sheet. If desired, the glass can be soda-lime glass. In other embodiments, the substrate can be plastic. In some cases, it is plexiglass. It may also be a plate of metal, e.g., copper, in which case it would preferably have an electrically insulating cover (e.g., film) over its manufactured surface.

In some embodiments, the substrate (which can optionally be glass sheet or another sheet-like substrate) has a major dimension of at least 30 inches, at least 40 inches, or at least 42 inches. The major dimension can, for example, be a length or width of the substrate. The dimensions (e.g., ranges) mentioned in this disclosure are merely exemplary; they are not limiting to the invention.

Thus, substrates of various sizes can be used in the present invention. Commonly, large-area substrates are used. Certain embodiments involve a substrate having a major dimension (e.g., a length or width) of at least 0.5 meter, such as at least 1 meter, at least 1.5 meters (e.g., between 2 and 4 meters), or perhaps even greater than 3 meters. In some cases, the substrate will be rectangular, although this is by no means required.

In some embodiments, the substrate 10 is a generally square or rectangular glass sheet. The substrate in these embodiments can optionally have any of the dimensions described in the preceding paragraph, in the following paragraph, or both.

Substrates of various thicknesses can be used in the present invention. In some embodiments, the substrate 10 (which can optionally be a glass sheet) has a thickness of about 1-5 mm. Certain embodiments involve a substrate 10 with a thickness of between about 2.3 mm and about 4.8 mm, such as between about 2.5 mm and about 4.8 mm. In one particular embodiment, a sheet of glass (e.g., soda-lime glass) with a thickness of about 3 mm is used. In one group of embodiments, the thickness of the substrate is between about 4 mm and about 20 mm. When the substrate is float glass, it will commonly have a thickness of between about 4 mm and about 19 mm. In another group of embodiments, the substrate is a thin sheet having a thickness of between about 0.35 mm and about 1.9 mm. It is to be appreciated that different substrate thicknesses can be chosen to meet the requirements of different embodiments.

In preferred embodiments, the substrate 10 is a sheet of patterned glass. In such cases, the surface 15 of the glass can be patterned using any glass patterning process suitable for producing the desired pattern. In the illustrated embodiments, the glass surface is patterned with a series of peaks and valleys. Many other patterns can be used, however, to provide the desired highland and lowland features. Examples include a field of pyramids, cones, spiral-shaped ridges, or combinations thereof. Thus, the illustrated pattern is by no limiting to the invention.

Suitable patterned glass can obtained commercially from a variety of sources, including Cardinal FG Company of Menomonie, Wis., USA. Alternatively, patterned glass can be made using well known glass patterning methods, such as those taught in U.S. Pat. Nos. 5,224,978 and 6,708,526, as well as in U.S. Patent Application Publication No. 2010/0154862, the contents of each of which are hereby incorporated herein by reference.

FIG. 1 depicts an exemplary substrate 10 having a manufactured surface 15 with a plurality of highland P and lowland V features. As noted above, the substrate 10 can optionally be patterned glass. In the embodiment of FIG. 2, the substrate's manufactured surface 15 comprises a plurality of peaks P and a plurality of valleys V, and a set of first surfaces A face a first common direction, while a set of second surfaces B face a second common direction. Here, the first surfaces A are on one side of the peaks P, while the second surfaces B are on another side (e.g., an opposite side) of the peaks.

As can be appreciated by referring to FIGS. 2-5, the invention provides methods wherein a first directional coating operation is performed so as to deposit a first film composition on the first surfaces A, and a second directional coating operation is performed so as to deposit a second film composition on the second surfaces B. Preferably, the second directional coating operation is performed after the first directional coating operation has been completed. After the coating operations have been completed, adjacent each peak P (e.g., at an apex or a top region thereof) there preferably is an interface IF of two different film regions AF, BF, one AF comprising the first film composition, the other BF comprising the second film composition. This is perhaps best seen in FIG. 7.

Various directional coating techniques can be used. In some cases, the first and second directional coating operations are directional vacuum deposition techniques. Directional sputtering, for example, is one suitable technique. Other directional coating techniques can be used, such as directional evaporation, electron beam evaporation, spray coating, galvanizing, electroplating, etc.

Figure 3:
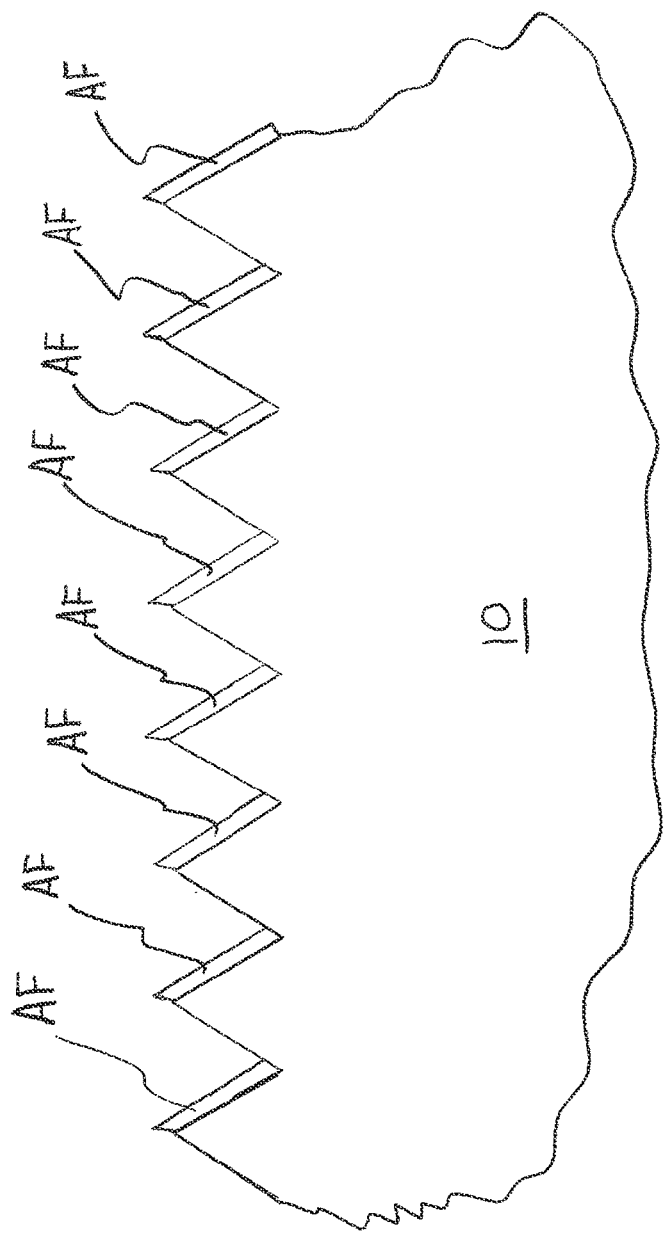
FIG. 3 is a broken away schematic cross sectional view of the substrate of FIG. 1, shown after being coated from the first directional coating angle of FIG. 2.
Figure 4:
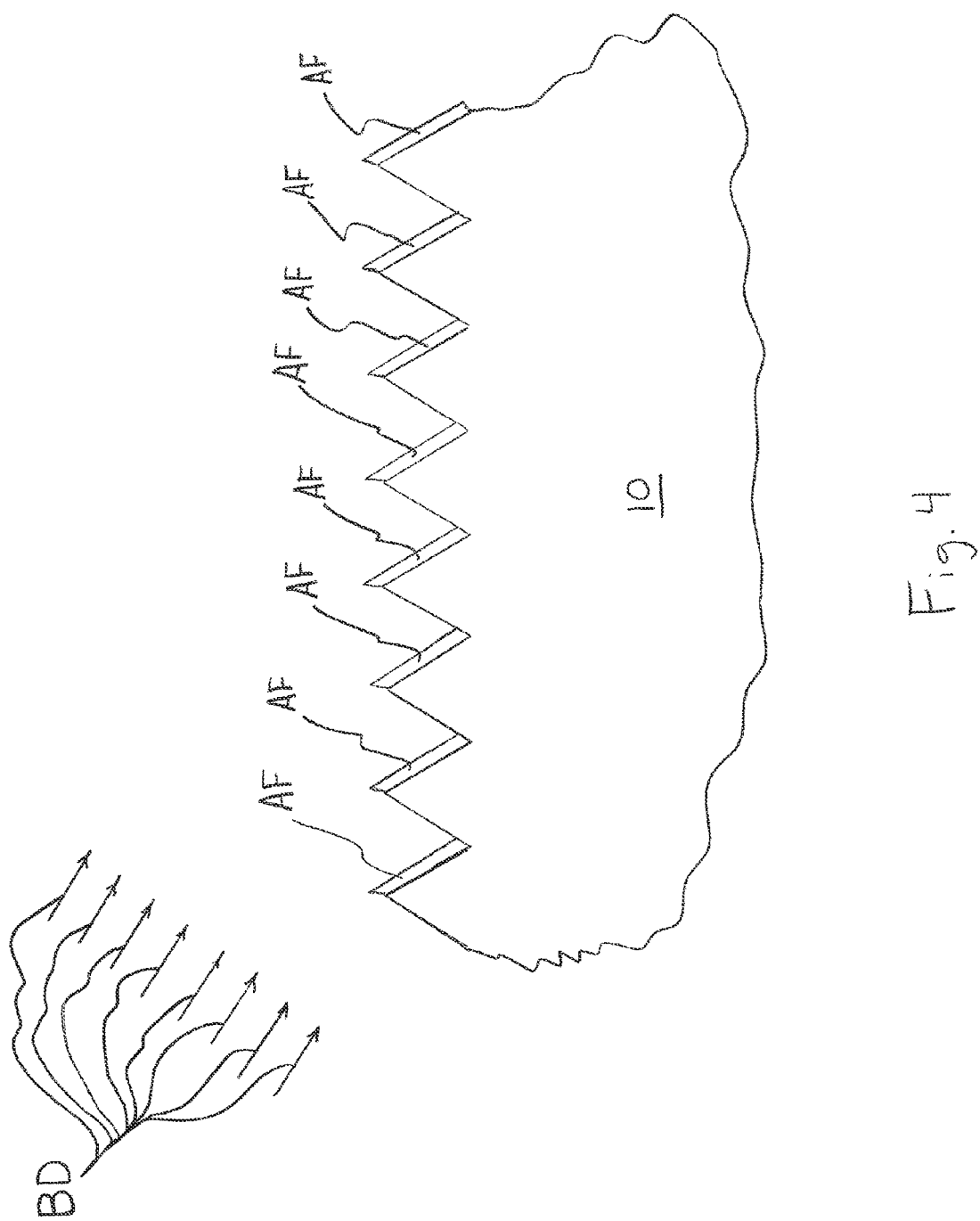
FIG. 4 is a broken away schematic cross sectional view of the substrate of FIG. 3, depicting a second directional coating angle in accordance with certain embodiments of the invention.

Thus, the coating technique used to produce the noted first AF and second BF film regions preferably involves a flux of coating material that travels substantially in a single direction (the arrows AD and BD, shown respectively in FIGS. 2 and 4, each represent such a directional flux of coating material). The directional coating technique can thus be used to create a shadowing phenomenon. For example, with the illustrated peaks-and-valleys surface 15, during the first directional coating operation (see FIGS. 2 and 3), the shadowing involves the noted first surfaces A being coated selectively, e.g., such that immediately following the first directional coating operation, the second surfaces B are coating free, substantially coating free, or at least have uncoated regions.

The foregoing sentence assumes that no coating has been applied to the manufactured surface 15 prior to the first coating operation; but that need not be the case. For example, it may be desirable to deposit one or more films onto the manufactured surface 15 before performing the noted first directional coating operation. Examples include adhesion-promoter films, electrical insulator films, sodium ion diffusion barrier films, etc. It may therefore simply be the case that, immediately following the first directional coating operation, the second surfaces B are free of the first film composition, substantially free of the first film composition, or at least have regions that are not coated with the first film composition.

Similarly, with a peaks-and-valleys surface 15 like that illustrated, during the second directional coating operation (see FIGS. 4 and 5), the shadowing involves the noted second surfaces B being coated selectively, e.g., such that immediately following the second directional coating operation, the first surfaces A are free of the second film composition, substantially free of the second film composition, or at least have regions that are not coated with the second film composition.

Thus, the first surfaces A of the manufactured surface 15 can be coated from one angle (see FIG. 2), and the second surfaces B can be coated from another angle. These two angles preferably are separated from each other by greater than 45 degrees, and more preferably greater than 60 degrees, such as by about 65-115 degrees, perhaps optimally by about 90 degrees. In some embodiments, the flux of the first coating composition travels in a direction AD that is substantially perpendicular to the noted first surfaces A, while the flux of the second coating composition travels in a direction BD that is substantially perpendicular to the noted second surfaces B.

In FIGS. 2 and 3, the illustrated peaks P shadow the second surfaces B during the first coating operation. Similarly, when the second surfaces B are coated from the other angle, i.e., during the second coating operation (see FIG. 4), the peaks P shadow the first surfaces A. The resulting coated substrate (see FIG. 5) has, adjacent to each peak P (e.g., at an apex thereof), an interface IF of two different film regions AF, BF, one film region AF comprising (or consisting essentially of, or consisting of) the first film composition, the other film region BF comprising (or consisting essentially of, or consisting of) the second film composition.

Figure 5:
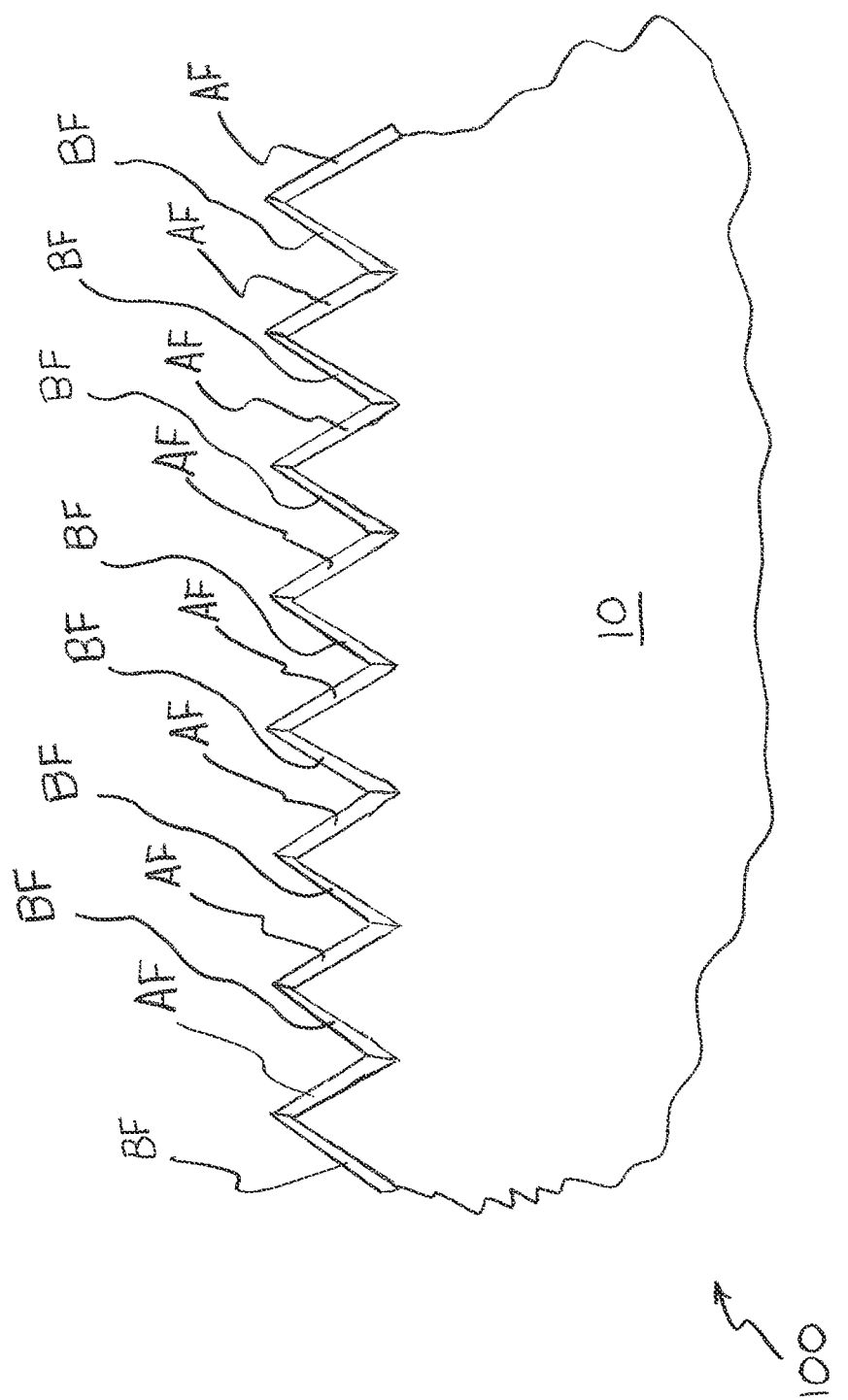
FIG. 5 is a broken away schematic cross sectional view of the coated substrate of FIG. 3, shown after being coated from the second directional coating angle of FIG. 4, the resulting coated substrate forming a thermoelectric device in accordance with certain embodiments of the invention.
Figure 7:
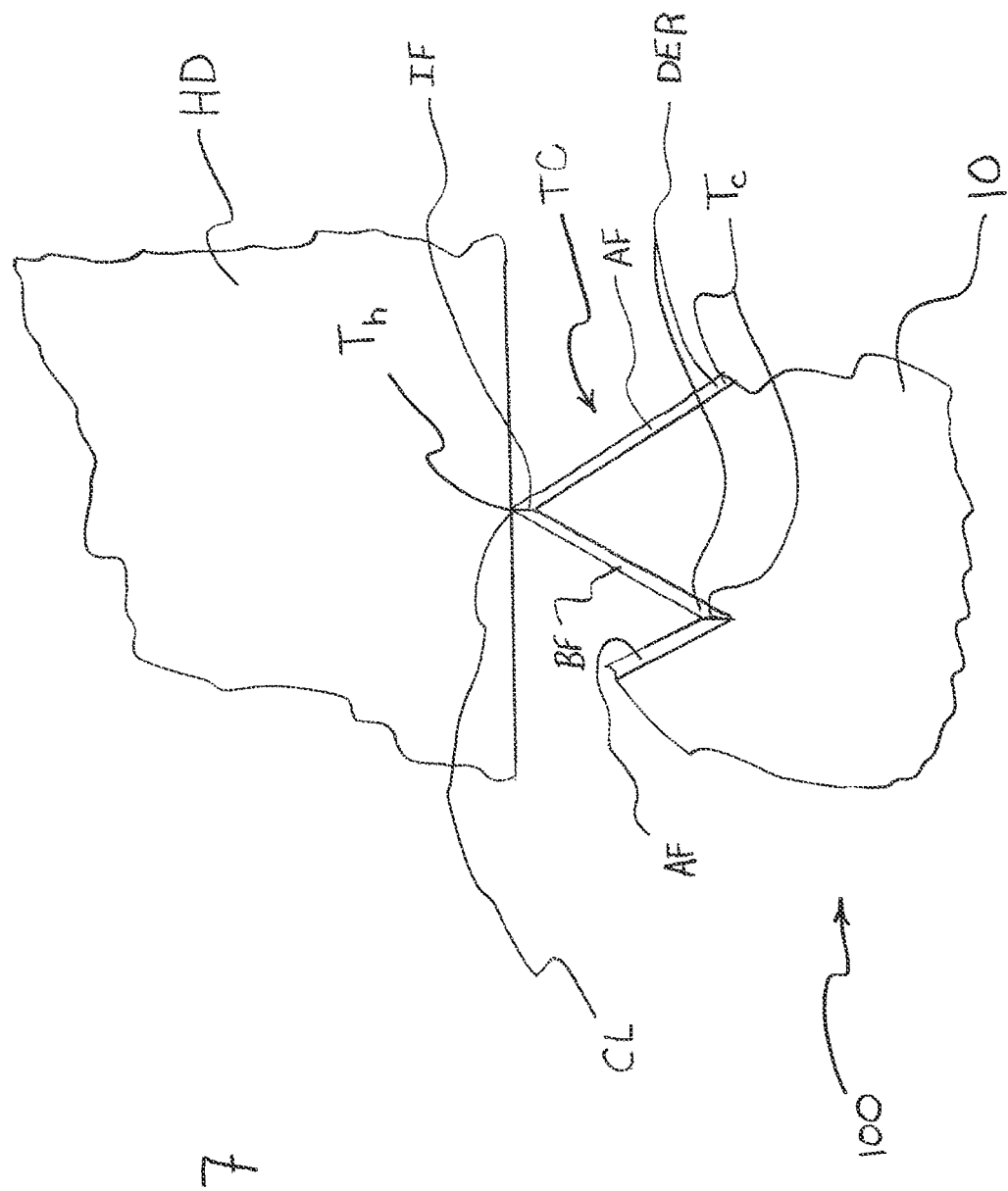
FIG. 7 is a broken away cross sectional detail view of region AA from FIG. 6.
Figure 8:
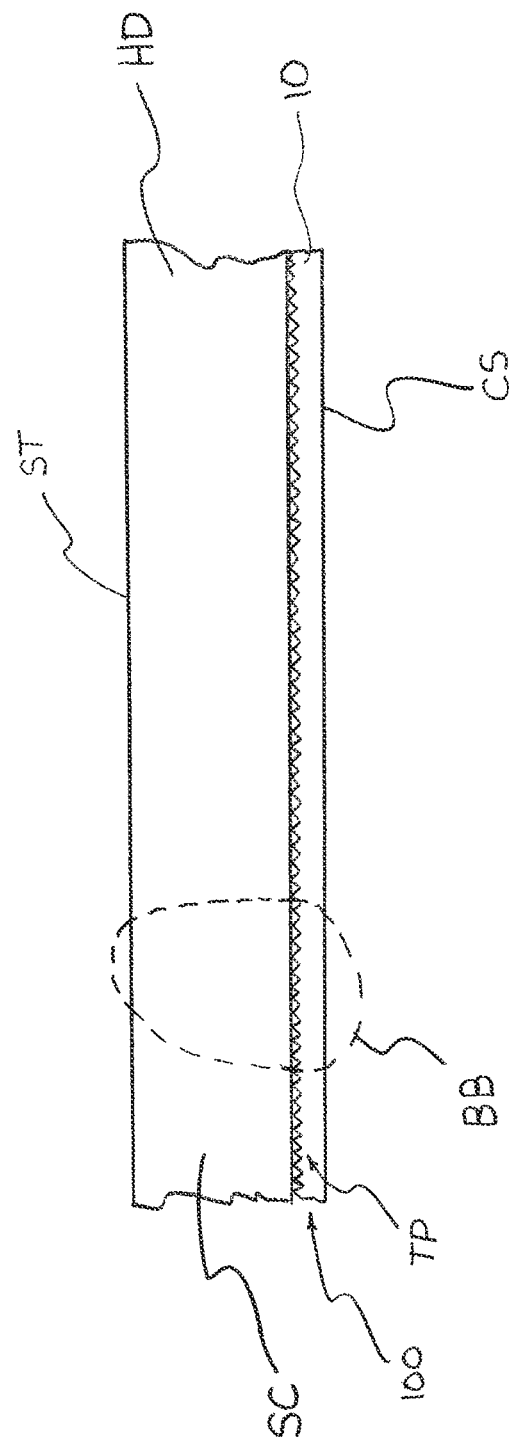
FIG. 8 is a broken away schematic cross sectional view of an exemplary thermoelectric device coupled to a photovoltaic device in accordance with certain embodiments of the invention.

In the embodiments shown in FIGS. 5-7, two different film regions AF, BF diverge away from each other with increasing distance from the interface IF and terminate at distal end regions DER (see FIG. 7). The film materials and thicknesses of the two film regions AF, BF are selected such that, in response to a temperature difference between the interface IF and the distal end regions DER of the two different film regions, the device 100 produces a voltage. Preferably, the voltage is proportional to a temperature difference between the interface IF and the distal end regions DER. Thus, the two different film regions AF, BF (e.g., each coupled pair of film regions AF, BF) preferably together form a thermocouple.

To produce such a thermocouple, the first film composition (i.e., first film region AF) and the second film composition (i.e., second film region BF) preferably are either formed of two different metals (the term "metal" here includes metal alloys), two different semiconductors, or one metal and one semiconductor. Thus, in the present device, two different conductors (optionally two different metal alloys) preferably produce a voltage proportional to a temperature difference between hot and cold ends of the device.

Insofar as the thickness of the coating is concerned, the first film composition and the second film composition are each preferably deposited to a thickness of between 0.1 microns and 20 microns, such as between about 0.5 microns and 10 microns, or between about 0.5 microns and 5 microns.

As noted above, on the resulting coated substrate, each highland feature P preferably defines a peak adjacent to which there is an interface IF of two different film regions AF, BF. The interface IF can optionally be at an apex of the peak, as illustrated. In embodiments like those exemplified by FIGS. 5-7, at the interface IF, the two different film regions AF, BF come together in an end-to-end fashion. While there may well be some overlap of the two films adjacent the interface, the two film regions AF, BF preferably are characterized by being provided in an end-to-end arrangement, rather than being one film coated over the entirety of the other film.

Thus, the two different film regions AF, BF preferably diverge away from each other with increasing distance from the interface IF and terminate at distal end regions DER. In such embodiments, in response to a temperature difference between the interface IF and the distal end regions DER of the two different film regions AF, BF, the device 100 produces a voltage, which preferably is proportional to the temperature difference. It may therefore be desirable to maximize this temperature difference. In a solar cell, for example, the back side of the solar cell may be exposed to an ambient environment and may therefore be cooled naturally by wind, convection, etc. Furthermore, the back of such a solar cell could be provided with a flow of cooling fluid or another cooling means, if desired.

In the illustrated configuration of the coated surface 15, the lowland features V comprise valleys, and the distal end regions DER of the two different film regions AF, BF are located in two adjacent valleys. In such embodiments, the valleys preferably are not occupied by any solid material, but rather are simply occupied by gas.

The present thermoelectric device 100 preferably comprises a number of thermocouples. Thus, at least part of the manufactured surface 15 preferably is covered by a coating comprising a number of first film regions AF and a number of second film regions BF. As noted above, the first film regions AF comprise a first film composition, and the second film regions BF comprise a second film composition. The first AF and second BF film compositions are different (this can include a base film material be doped with one dopant for the first film region while being doped with a different dopant for the second film region). In the illustrated design, the coating is arranged such that each first film region AF extends between a peak interface with one second film region and a valley interface with another second film region, while each second film region extends between a peak interface with one first film region and a valley interface with another first film region. This is best shown in FIGS. 5 and 6.

Thus, certain embodiments of the thermoelectric device 100 are characterized by having a plurality of highland features and a plurality of lowland features that respectively comprise a plurality of peaks and a plurality of valleys, and where a set of first surfaces A facing a first common direction are coated with a first film composition, and a set of second surfaces B facing a second common direction are coated with a second film composition.

The invention also provides embodiments wherein the thermoelectric device 100 is provided in combination with a heat source device HD. Reference is made to FIGS. 6-9. Here, the manufactured surface 15 of the substrate 10 is carried against the heat source device HD such that the highland features P contact the heat source device. As noted above, the heat source device HD can be a machine, device, or another object that generates, emits, and/or possesses heat. In some embodiments, the heat source device HD is a photovoltaic device (e.g., a solar cell) SC having opposed front ST and rear HS faces. In such embodiments, the photovoltaic device SC can optionally take the form of a panel.

Referring to FIG. 9, the front face ST of the photovoltaic device SC preferably is adapted to receive incident solar radiation, and the manufactured surface 15 of the thermoelectric device 100 preferably is carried against the photovoltaic device such that the highland features P contact the rear surface HS of the photovoltaic device 100.

In embodiments of this nature, by providing small areas of contact between the thermoelectric device 100 and the heat source device HD, heat flowing between the two devices must travel along a small thermal path. Moreover, the interface IF between the noted film regions AF, BF preferably is adjacent to (e.g., at) the contact locations (which can be lines, points, or other localized areas of contact) CL between the two devices HD, 100. As a result, heat flowing from the heat source device HD to the thermoelectric device 100 passes through the film interface IF and creates a hot side $T_h$ adjacent to (e.g., at) that interface. Reference is made to FIG. 7.

As is perhaps best seen in FIG. 6, thermal insulation spaces TES preferably are defined between the lowland features V of the thermoelectric device 100 and the rear surface HS of the heat source device HD, which in some case is a photovoltaic device SC. These thermal insulation spaces TES, for example, can simply be air gaps between the two devices HD, 100. If desired, it may be possible to evacuate these spaces or fill them with an insulative gas, but doing so is by no means required.

Referring to FIG. 7, the illustrated peak P is characterized by a generally triangular, mountain-like configuration in cross section. As noted above, however, other peak configurations can be used.

Thus, in certain embodiments, adjacent to each peak ridge there preferably is an interface of two different film regions AF, BF, optionally in combination with there being an interface of two different film regions AF, BF adjacent to each valley bottom.

In the exemplary embodiment of FIG. 5, the two film regions AF, BF may each be a single layer of material. Alternatively, one or both such film regions may comprise multiple layers of material, e.g., multiple layers of different material. Additionally or alternatively, a given film region AF, BF may be applied in a single operation, or multiple operations may be carried to deposit such a film region. For example, certain embodiments provide a deposition method comprising a sequence of depositions including: a first A-film deposition from a first angle, followed by a first B-film deposition from a second angle, followed by a second A-film deposition from the first angle, followed by a second B-film deposition from the second angle. Such alternating deposition steps may be repeated more or less times.

Insofar as the photovoltaic device SC is concerned, it is contemplated that virtually any known solar cell type may be used. Commonly, the photovoltaic device will comprise a front electrode FE, a rear electrode RE, and a photovoltaic film 50 between those electrodes. The photovoltaic film 50 may in some cases comprise two semiconductor films 52, 54 (e.g., one p-type semiconductor layer, and one n-type semiconductor layer) defining between them a junction. Radiation incident upon the semiconductors creates electron-hole pairs, and charge carriers migrate across the junction in opposite directions, so that an electrical charge results. An electrical current is then obtained in an external electrical circuit by forming ohmic contacts to the front and rear electrodes. The production and wiring of solar cells are well known to people skilled in the field of photovoltaics. Suitable solar cells are commercially available from a variety of well known suppliers. In addition, useful solar cells can be manufactured using various well known methods for producing photovoltaic devices.

While some preferred embodiments of the invention have been described, it should be understood that various changes, adaptations and modifications may be made therein without departing from the spirit of the invention and the scope of the appended claims.

What is claimed is:

1. A method of producing a thermoelectric device, the method comprising:
    a) providing a patterned glass sheet having a dimension of at least 30 inches and comprising a plurality of first surfaces aligned parallel to each other, each of the plurality of first surfaces having a constant slope and facing a first common direction and a plurality of second surfaces aligned parallel to each other, each of the plurality of second surfaces having a constant slope and facing a second common direction, the plurality of first surfaces and the plurality of second surfaces meeting to form a plurality of peaks and valleys, each peak having a tip-like apex,
    b) performing a first directional coating operation so as to deposit a first film composition on the plurality of first surfaces, wherein during the first directional coating operation, the first film composition travels in a direction that is perpendicular to the plurality of first surfaces, such that following the first directional coating operation, the plurality of second surfaces are free of the first film composition, and
    c) and performing a second directional coating operation after the first directional coating operation so as to deposit a second film composition on the plurality of second surfaces, wherein during the second directional coating operation the second film composition travels in a direction that is perpendicular to the plurality of second surfaces, such that following the second directional coating operation, the plurality of first surfaces are free of the second film composition,
    wherein as a result of said first and second directional coating operations, an interface is formed between the first and second film compositions at each of the plurality of peaks and each of the plurality of valleys wherein direct contact is made between the first film composition and the second film composition at each interface, and wherein in response to a temperature difference between the interfaces formed at each of the plurality of peaks and the interfaces formed at each of the plurality of valleys, the device produces a voltage.

2. The method of claim 1 wherein the first and second directional coating operations comprise vacuum deposition techniques.

3. The method of claim 1 wherein the first and second directional coating operations comprise sputter deposition techniques.

4. The method of claim 1 wherein the first film composition and the second film composition are each deposited to a thickness of between 0.1 microns and 20 microns.

5. The method of claim 1 wherein the first film composition and the second film composition are formed of two different metals, two different semiconductors, or one metal and one semiconductor.

6. The method of claim 1 further including providing a photovoltaic device having a front face and an opposing rear face and comprising a front electrode, a rear electrode, and a photovoltaic film between the front and rear electrodes, the front face of the photovoltaic device being adapted to receive incident solar radiation; and coupling the patterned glass sheet to the photovoltaic device such that the plurality of peaks contact the rear face of the photovoltaic device.

* * * * *